United States Patent
Imbruglia et al.

(10) Patent No.: US 6,346,840 B1
(45) Date of Patent: Feb. 12, 2002

(54) ELECTRONIC DEVICE FOR CONTROLLING THE "BOUNCING" IN ELECTRONIC CIRCUITS INTEGRATED ON SEMICONDUCTOR SUBSTRATE

(75) Inventors: Antonio Imbruglia, Catania; Maria Leena Airaksinen, Tremestieri Etneo; Sebastiano Moscuzza, Misterbianco, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/660,776

(22) Filed: Sep. 13, 2000

(30) Foreign Application Priority Data

Sep. 13, 1999 (EP) ............................... 99830573

(51) Int. Cl.⁷ ............................................. H03K 5/12
(52) U.S. Cl. ................... 327/170; 327/112; 327/401; 327/404
(58) Field of Search .................... 326/26, 27, 85, 326/87, 91; 327/108, 109, 110, 111, 112, 170, 401, 403, 404, 405

(56) References Cited

U.S. PATENT DOCUMENTS

| | | | | |
|---|---|---|---|---|
| 4,992,676 A | * | 2/1991 | Gerosa et al. | 307/443 |
| 5,111,075 A | * | 5/1992 | Ferry et al. | 307/443 |
| 5,359,239 A | | 10/1994 | Sato | 307/451 |
| 5,440,258 A | * | 8/1995 | Galbi et al. | 327/112 |
| 5,781,050 A | * | 7/1998 | Russell | 327/170 |
| 5,838,186 A | * | 11/1998 | Inoue et al. | 327/389 |
| 5,854,560 A | * | 12/1998 | Chow | 326/27 |
| 6,172,516 B1 | * | 1/2001 | Han et al. | 326/27 |

FOREIGN PATENT DOCUMENTS

EP    0 292 641    11/1988    .......... H01L/27/02

OTHER PUBLICATIONS

Patent Abstracts of Japan, vol. 015, No. 108 (E–1045), Mar. 14, 1991—& JP 03 001571 A (Toshiba Corp), Jan. 8, 1991 *abstract*.
Patent Abstracts of Japan, vol. 008, No. 264 (E–282), Dec. 4, 1984—&JP 59 134869 A (Nippon Denki KK), Aug. 2, 1984 *abstract*.

* cited by examiner

Primary Examiner—Jeffrey Zweizig
(74) Attorney, Agent, or Firm—Lisa K. Jorgenson; Allen, Dyer, Doppelt, Milbrath & Gilchrist, P.A.

(57) ABSTRACT

An electronic device for controlling oscillation of an output voltage about a final value includes a semiconductor substrate, and at least one output stage on the semiconductor substrate. The at least one output stage includes at least one output transistor for providing an output voltage to an external load connected thereto. The output transistor includes a plurality of transistor legs connected in parallel and having different channel lengths. Each transistor leg is individually turned on and at different times for controlling oscillation of the output voltage about the final value.

26 Claims, 2 Drawing Sheets

ELECTRONIC DEVICE FOR CONTROLLING THE "BOUNCING" IN ELECTRONIC CIRCUITS INTEGRATED ON SEMICONDUCTOR SUBSTRATE

FIELD OF THE INVENTION

The present invention relates to electronic circuits, and, more particularly, to an electronic device for controlling the bouncing or oscillating of an output signal about its final value in an integrated electronic circuit.

The invention relates particularly, but not exclusively, to an electronic device for controlling the switching of an output of a CMOS electronic circuit integrated on a semiconductor substrate. The electronic device includes at least one MOS transistor output stage for driving an external load.

BACKGROUND OF THE INVENTION

Bouncing appears in integrated electronic circuits as certain digital output signals switch between two logic states. Bouncing is the transient decaying oscillations about a final value. These integrated circuits include a final output stage for each circuit output, which are essentially an interface circuit for driving an external load.

The current design of integrated circuits operating at a low voltage requires an ever larger drive current I (e.g., 24 mA to 48 mA per output) for the external loads. The variation of this current during switching of the output signal induces a voltage which follows the equation V=LdI/dt. This is due to the presence of inductive components L, which are attributable to parasitic inductances in the package itself and to the connecting cables. A typical value of this induced voltage would be around 500 mV.

The significance of this voltage increases as several outputs are switched simultaneously in the integrated electronic circuit. This is due to the induced voltage at that output, which will affect the voltages at one or more of the adjacent outputs. The induced voltage at the output occurs when one output of the integrated circuit switches over. Then, after the outputs have switched over, the output voltage will be oscillating about its final value, i.e., bouncing, before it becomes settled at a voltage value corresponding to a high or a low logic state.

One method of minimizing this induced voltage includes controlling the leading edge of the drive voltage, that is, the slew rate of the integrated circuit output stage. A first approach includes dividing each final output stage into a plurality of parallel stages, wherein all the stages are identical. These stages include active circuitry whereby the individual stages can be turned on sequentially. Thus, the switching edge of the current becomes offset or stepped, and the current variation can be much smaller. While being advantageous, this first approach has drawbacks, such as the control circuitry being quite complicated for these stages.

A second approach is described in European Patent Application No. 678983. This application is incorporated herein by reference in its entirety, and is assigned to the assignee of the present invention. A circuit is disclosed in the application in which a current generator is used for controlling the leading edge of the drive current. Although achieving its objective, this second approach also involves a circuit arrangement which is fairly complicated and expensive to manufacture.

SUMMARY OF THE INVENTION

In view of the foregoing background, it is an object of the present invention to provide a final stage for an integrated circuit which is easily implemented and has structural and functional features for providing improved control of the output signal leading edges, thereby overcoming the limitations and drawbacks of prior art output stages.

This and other objects, features and advantages are provided by an output stage of an electronic device comprising a MOS transistor having a plurality of gate regions of different lengths for turning on the device sections.

More particularly, the electronic device may comprise a semiconductor substrate, and at least one output stage on the semiconductor substrate. The output stage may compromise at least on output transistor for providing an output voltage to an external load connected thereto. The output transistor preferably comprises a plurality of transitor legs connected in parallel, with each transistor leg comprising a transistor having a channel defined therein.

A length of each respective channel is preferably different from a length of other channels among the plurality of transistors legs, and each transistor leg is preferably individually turned on and at different times for controlling oscillation of the output voltage about a final value.

The output stage preferably comprises a CMOS inverting stage, and the at least on transistor preferably comprises a pair of transistors connected in series. A first transistor of the pair of transistors connected to a first voltage reference, and a second transistor of the pair of transistors may be connected to a second voltage reference.

The pair of transistors preferably comprises a pull-up transistor and a pull-down transistor, wherein the pull-up transistor comprises an p-type transistor and pull-down transistor comprises an N-type transistor. The different channel lengths for the plurality of transistor legs preferably have increasing lengths, wherein the lengths increase within a range of about 0.3 mm to 0.6 mm. The plurality of transistor legs preferably have the same channel width.

BRIEF DESCRIPTION OF THE DRAWINGS

The features and advantages of a device according to the invention can be more clearly understood from the following description of an embodiment thereof, given by way of an example and not of limitation with reference to the accompanying drawings.

DETAILED DESCRIPTION OF THE PREFERRED EMBODIMENTS

Figure 1:
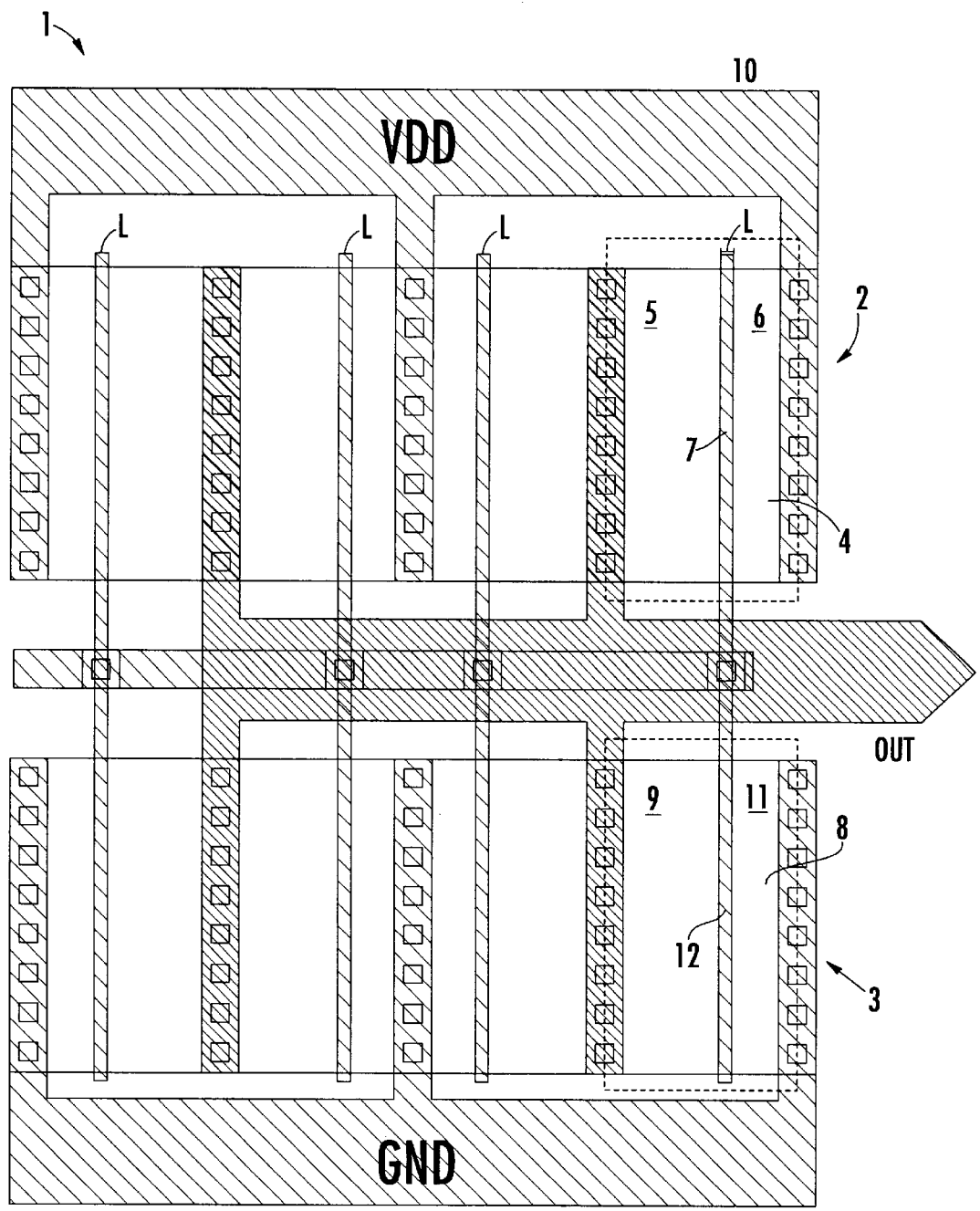
FIG. 1 is a schematic top plan view of an output stage of an electronic device according to the present invention.

Referring to the drawings figures, an output stage comprises a CMOS inverting stage 1 integrated in a semiconductor substrate 10. This CMOS inverting stage 1 is formed of a P-type MOS transistor 2 (pull-up device) and an N-type MOS transistor 3 (pull-down device) which are connected in series between a first supply voltage reference VDD and a second voltage reference, e.g., ground GND, of an integrated circuit.

A common node OUT of the two transistors 2, 3 represents an output of the final output stage 1 and is connected to interconnections pads. According to the invention, the P-type MOS transistor 2 has a plurality of "legs", each comprising a transistor 4. The transistors 4 are all connected in parallel together.

Each MOS transistor 4 has a drain region 5 and a source region 6. These regions 5, 6 are separated by a channel region overlaid by a gate region 7 which is isolated from the substrate 10 by an oxide layer. In the embodiment illustrated in FIG. 1, four transistors 4 are shown connected in parallel together.

In an embodiment of the invention, each of the transistors 4, which are included as part of the P-type MOS transistor 2, has a channel region of different length L but the same width W. For example, in one advantageous embodiment, the channel lengths have increasing values from 0.35 mm to 0.6 mm.

In view of the fact that the turn-on resistance Ron of a MOS transistor is a function of the channel region length, it is possible to turn on the various transistors 4 (which are part of the P-type MOS transistor 2) sequentially by driving the gate regions of the transistors 4 with the same voltage. This construction provides a gradual switching of the output current. The output current is, in fact, increased gradually as the legs 4 of the transistor 2 are turned on in succession.

The N-type MOS transistor 3 similarly has a plurality of "legs", each comprising a MOS transistor 8. These transistors 8 are connected in parallel together. Each MOS transistor 8 has conventionally a drain region 9 and a source region 11. These regions 9, 11 are separated by a channel region overlaid by a gate region 12 which is isolated from the substrate 10 by an oxide layer.

In the embodiment illustrated in FIG. 1, four such transistors 8 are shown connected in parallel together. In an embodiment of the invention, each of the transistors 8, which is included as part of the N-type MOS transistor 3, has a channel region of different length L but the same width W. In one advantageous embodiment, the channel lengths have increasing values from 0.35 mm to 0.6 mm.

Figure 2:
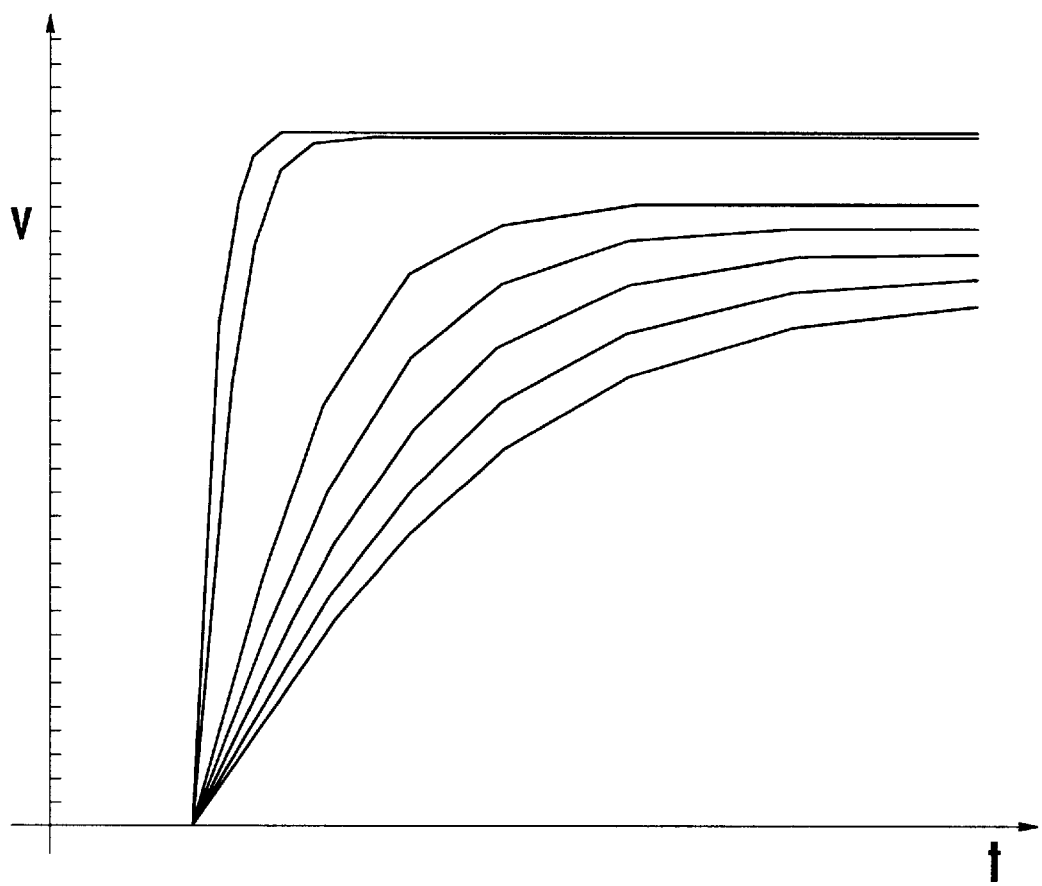
FIG. 2 is a plot of the output voltages for different transistor legs of the output stage illustrated in FIG. 1.

The operation of the N-type MOS transistor 3, as driven by appropriate currents, is similar to that of the P-type MOS transistor previously described. To summarize, the electronic device 2, 3 of this invention enables the switching of the output drive current to be controlled by an arrangement having no need of a control logic for producing abnormal turn-ons, which greatly simplifies the control logic. FIG. 2 shows the results of a simulation of the output circuit that was performed by the Applicants. In this figure, different output voltages can be seen for different transistor legs of the output stage as illustrated in FIG. 1.

That which is claimed is:

1. An electronic device comprising:
   a semiconductor substrate; and
   at least one output stage on said semiconductor substrate, said at least one output stage comprising at least one output transistor for providing an output voltage to an external load connected thereto;
   said at least one output transistor comprising a plurality of transistor legs connected in parallel, each transistor leg comprising a transistor having a channel defined therein, a length of each respective channel being different from a length of other channels among the plurality of transistors legs, and each transistor leg being structured to be individually turned on.

2. An electronic device according to claim 1, wherein each transistor leg is individually turned on at different times for controlling oscillation of the output voltage about a final value.

3. An electronic device according to claim 1, wherein said at least one output stage comprises a CMOS inverting stage.

4. An electronic device according to claim 1, wherein said at least one output transistor comprises a pair of output transistors connected in series.

5. An electronic device according to claim 4, wherein a first transistor of said pair of output transistors is connected to a first voltage reference, and a second transistor of said pair of output transistors is connected to a second voltage reference.

6. An electronic device according to claim 4, wherein said pair of output transistors comprises a pull-up transistor and a pull-down transistor.

7. An electronic device according to claim 6, wherein said pull-up transistor comprises a P-type transistor and said pull-down transistor comprises an N-type transistor.

8. An electronic device according to claim 1, wherein said plurality of transistor legs define a series of different channel lengths.

9. An electronic device according to claim 8, wherein a spacing between adjacent channel lengths in the series is in a range of about 0.3 mm to 0.6 mm.

10. An electronic device according to claim 1, wherein each channel of the plurality of transistor legs has a same channel width.

11. An electronic device comprising:
    a semiconductor substrate; and
    at least one CMOS output stage on said semiconductor substrate, said at least one CMOS output stage comprising a pull-up transistor and a pull-down transistor connected in series for providing an output voltage to an external load connected thereto;
    said pull-up transistor and said pull-down transistor each comprising a plurality of transistor legs connected in parallel, each transistor leg comprising a transistor having a channel defined therein, a length of each respective channel being different from a length of other channels among the plurality of transistors legs, and each transistor leg being individually turned on and at different times for controlling oscillation of the output voltage about a final value.

12. An electronic device according to claim 11, wherein said pull-up transistor is connected to a first voltage reference, and said pull-down transistor is connected to a second voltage reference.

13. An electronic device according to claim 11, wherein said pull-up transistor comprises a P-type transistor and said pull-down transistor comprises an N-type transistor.

14. An electronic device according to claim 11, wherein said plurality of transistor legs define a series of different channel lengths.

15. An electronic device according to claim 14, wherein a spacing between adjacent channel lengths in the series is in a range of about 0.3 mm to 0.6 mm.

16. An electronic device according to claim 11, wherein each channel of the plurality of transistor legs has a same channel width.

17. A method for controlling oscillation of an output voltage about a final value in an electronic device comprising a semiconductor substrate and at least one output stage on the semiconductor substrate, the at least one output stage comprising at least one output transistor comprising a plurality of transistor legs connected in parallel, each transistor leg comprising a transistor having a channel defined therein and a length of each respective channel being different from a length of other channels among the plurality of transistors legs, the method comprising:

individually turning on each transistor leg at different times for controlling oscillation of the output voltage about a final value; and providing the output voltage from the at least one output stage to an external load connected thereto.

18. A method according to claim 17 wherein individually turning on each transistor leg comprises sequentially driving a conduction terminal of each transistor leg with a same voltage to provide a gradual switching of the output voltage.

19. A method according to claim 17, wherein the at least one output stage comprises a CMOS inverting stage.

20. A method according to claim 17, wherein the at least one output transistor comprises a pair of output transistors connected in series.

21. A method according to claim 20, wherein a first transistor of the pair of output transistors is connected to a first voltage reference, and a second transistor of the pair of output transistors is connected to a second voltage reference.

22. A method according to claim 20, wherein the pair of output transistors comprises a pull-up transistor and a pull-down transistor.

23. A method according to claim 22, wherein the pull-up transistor comprises a P-type transistor and the pull-down transistor comprises an N-type transistor.

24. A method according to claim 20, wherein the plurality of transistor legs define a series of different channel lengths.

25. A method according to claim 24, wherein a spacing between adjacent channel lengths in the series is in a range of about 0.3 mm to 0.6 mm.

26. A method according to claim 17, wherein each channel of the plurality of transistor legs has a same channel width.

* * * * *

UNITED STATES PATENT AND TRADEMARK OFFICE
CERTIFICATE OF CORRECTION

PATENT NO. : 6,346,840 B1  Page 1 of 1
DATED : February 12, 2002
INVENTOR(S) : Antonio Imbruglia, Maria Leena Airaksinen and Sebastiano Moscuzza It is certified that error appears in the above-identified patent and that said Letters Patent is hereby corrected as shown below:

<u>Column 2,</u>
Line 11, delete "compromise" insert -- comprise --
Line 12, delete "on" insert -- one --
Line 24, delete "on" insert -- one --
Line 31, delete "an p-type" insert -- a P-type --

Signed and Sealed this

Eighteenth Day of June, 2002

*Attest:*

*Attesting Officer*

JAMES E. ROGAN
*Director of the United States Patent and Trademark Office*